US011683992B2

(12) United States Patent
Jeong et al.

(10) Patent No.: US 11,683,992 B2
(45) Date of Patent: Jun. 20, 2023

(54) MAGNETIC MEMORY DEVICE

(71) Applicant: Samsung Electronics Co., Ltd., Suwon-si (KR)

(72) Inventors: Hyungjong Jeong, Seongnam-si (KR); Ki Woong Kim, Hwaseong-si (KR); Younghyun Kim, Seoul (KR); Junghwan Park, Seoul (KR); Byoungjae Bae, Hwaseong-si (KR); Se Chung Oh, Yongin-si (KR); Jungmin Lee, Gwangmyeong-si (KR); Kyungil Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 229 days.

(21) Appl. No.: 17/134,456

(22) Filed: Dec. 27, 2020

(65) Prior Publication Data

US 2021/0359198 A1    Nov. 18, 2021

(30) Foreign Application Priority Data

May 15, 2020 (KR) .................. 10-2020-0058086

(51) Int. Cl.
*H10N 50/80* (2023.01)
*H10N 50/01* (2023.01)
*H10B 61/00* (2023.01)
*H01L 43/02* (2006.01)
*H01L 43/12* (2006.01)
*H01L 27/22* (2006.01)

(52) U.S. Cl.
CPC ............ *H01L 43/02* (2013.01); *H01L 27/222* (2013.01); *H01L 43/12* (2013.01)

(58) Field of Classification Search
CPC ...... H01L 43/02; H01L 27/222; H01L 21/768
See application file for complete search history.

(56) References Cited

U.S. PATENT DOCUMENTS

| 7,777,214 | B2 | 8/2010 | Shin et al. |
| 9,054,030 | B2 | 6/2015 | Kinney et al. |
| 9,373,782 | B2 | 6/2016 | Li et al. |
| 9,548,333 | B2 | 1/2017 | Lu et al. |
| 9,865,806 | B2 | 1/2018 | Choi et al. |
| 10,897,006 | B2 | 1/2021 | Lee et al. |
| 2018/0108835 | A1 | 4/2018 | Huang et al. |
| 2018/0159023 | A1* | 6/2018 | Suh .................. H01L 43/02 |
| 2018/0211995 | A1* | 7/2018 | Bak .................. H01L 27/228 |

(Continued)

FOREIGN PATENT DOCUMENTS

CN      110718568 A    1/2020
KR   1020180133278 A   12/2018

*Primary Examiner* — Shih Tsun A Chou
(74) *Attorney, Agent, or Firm* — Muir Patent Law, PLLC

(57) ABSTRACT

A magnetic memory device may include an interlayer insulating layer on a substrate, a bottom electrode contact disposed in the interlayer insulating layer, and a magnetic tunnel junction pattern on the bottom electrode contact. The bottom electrode contact may include a second region and a first region, which are sequentially disposed in a first direction perpendicular to a top surface of the substrate so that the second region is between the first region and the top surface of the substrate. A first width of the first region may be smaller than a second width of the second region, when measured in a second direction parallel to the top surface of the substrate.

18 Claims, 17 Drawing Sheets

(56) References Cited

U.S. PATENT DOCUMENTS

| | | |
|---|---|---|
| 2018/0350875 A1 | 12/2018 | Han et al. |
| 2018/0351091 A1 | 12/2018 | Chuang et al. |
| 2019/0096753 A1 | 3/2019 | Lin et al. |
| 2019/0252606 A1 | 8/2019 | Pirovano et al. |
| 2019/0326509 A1 | 10/2019 | Yi et al. |
| 2021/0066578 A1* | 3/2021 | Doris .................... H01L 27/222 |
| 2021/0066581 A1* | 3/2021 | Doris ...................... H01L 43/12 |

* cited by examiner

MAGNETIC MEMORY DEVICE

CROSS-REFERENCE TO RELATED APPLICATIONS

This U.S. non-provisional patent application claims priority under 35 U.S.C. § 119 to Korean Patent Application No. 10-2020-0058086, filed on May 15, 2020, in the Korean Intellectual Property Office, the entire contents of which are hereby incorporated by reference.

BACKGROUND OF THE INVENTION

The present disclosure relates to a semiconductor device, and in particular, to a magnetic memory device and a method of fabricating the same.

Due to an increasing demand for electronic devices with increased speed and/or reduced power consumption, semiconductor devices require faster operating speeds and/or lower operating voltages. Magnetic memory devices have been suggested to satisfy such requirements. For example, the magnetic memory device can provide technical advantages, such as high performance and/or non-volatility. As a result, the magnetic memory devices are emerging as next-generation memory devices.

A magnetic memory device includes a magnetic tunnel junction (MTJ) pattern. The MTJ pattern may include two magnetic layers and an insulating layer interposed therebetween. An electric resistance of the MTJ pattern depends on magnetization directions of the magnetic layers. For example, the resistance of the MTJ pattern is higher when magnetization directions of the magnetic layers are anti-parallel to each other than when they are parallel to each other. Such a difference in electric resistance can be used for data storing operations of the magnetic memory device.

However, more research is still needed to mass-produce the magnetic memory device and satisfy demands for the magnetic memory device with higher integration density and lower power consumption properties.

SUMMARY

An embodiment of the inventive concept provides a magnetic memory device, which is configured to reduce a process failure, and a method of fabricating the same.

An embodiment of the inventive concept provides a magnetic memory device with improved electric characteristics and a method of fabricating the same.

According to an embodiment of the inventive concept, a magnetic memory device may include a lower interlayer insulating layer on a substrate, a bottom electrode contact disposed in the lower interlayer insulating layer, and a magnetic tunnel junction pattern on the bottom electrode contact. The bottom electrode contact may include a second region and a first region, which are sequentially disposed in a first direction perpendicular to a top surface of the substrate so that the second region is between the first region and the top surface of the substrate. A first width of the first region of the bottom electrode contact may be smaller than a second width of the second region of the bottom electrode contact, when measured in a second direction parallel to the top surface of the substrate.

According to an embodiment of the inventive concept, a magnetic memory device may include a first interlayer insulating layer on a substrate, a bottom electrode contact on the first interlayer insulating layer, a second interlayer insulating layer covering the bottom electrode contact, and a magnetic tunnel junction pattern on the bottom electrode contact and the second interlayer insulating layer. Each of the bottom electrode contacts may include a third region, a second region, and a first region, which are sequentially arranged in a first direction perpendicular to a top surface of the substrate. A first width of the first region of the bottom electrode contact may be smaller than a second width of the second region of the bottom electrode contact, when measured in a second direction parallel to the top surface of the substrate. A third width of the third region of the bottom electrode contact may be larger than the second width of the second region of the bottom electrode contact, when measured in the second direction.

According to an embodiment of the inventive concept, a magnetic memory device may include a lower interconnection line on a substrate, a first interlayer insulating layer provided on the substrate to cover a side surface of the lower interconnection line, a bottom electrode contact on the first interlayer insulating layer, a second interlayer insulating layer covering a side surface of the bottom electrode contact, a lower insulating layer interposed between the first interlayer insulating layer and second interlayer insulating layer, and a data storing structure on the bottom electrode contact. The data storing structure may include a bottom electrode, a magnetic tunnel junction pattern, and a top electrode, which are sequentially stacked on the bottom electrode contact. The second interlayer insulating layer may have recessed regions provided at opposite sides of the data storing structure, from a cross-sectional view. The bottom electrode contact may include a plurality of first regions and a plurality of second regions, which are alternately stacked in a first direction perpendicular to the top surface of the substrate. When measured in a direction parallel to the top surface of the substrate, each of the first regions of the bottom electrode contact may have a first width and each of the second regions of the bottom electrode contact may have a second width different from the first width.

DETAILED DESCRIPTION

Example embodiments of the inventive concepts will now be described more fully with reference to the accompanying drawings, in which example embodiments are shown.

Figure 1:
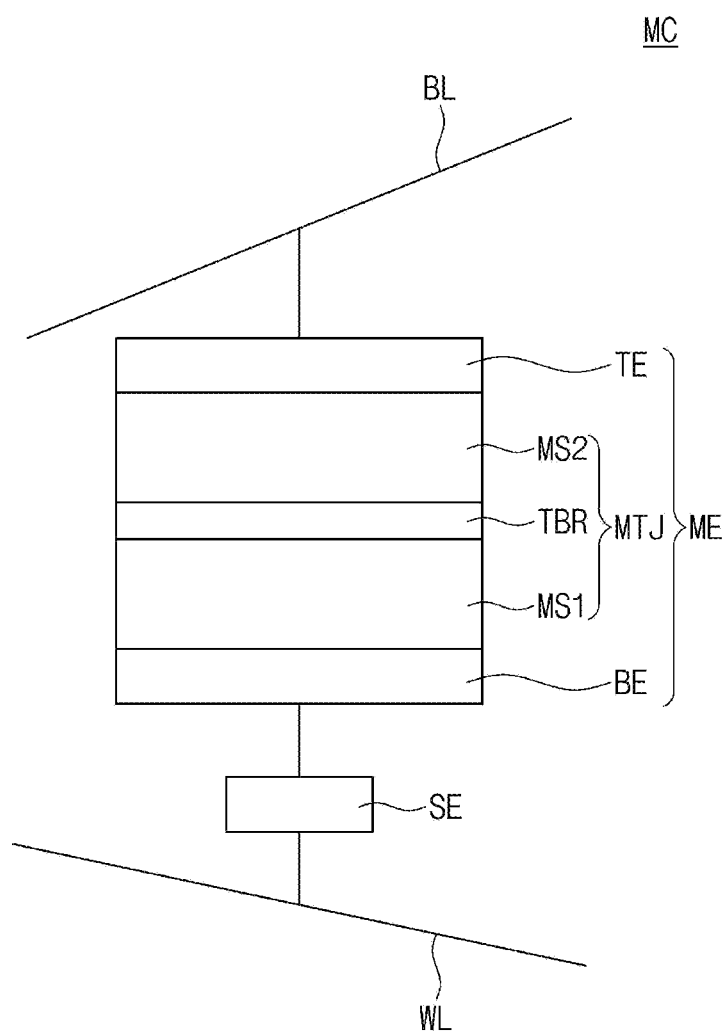
FIG. 1 is a circuit diagram illustrating a unit memory cell of a magnetic memory device according to an embodiment of the inventive concept.

FIG. 1 is a circuit diagram illustrating a unit memory cell of a magnetic memory device according to an embodiment of the inventive concept.

Referring to FIG. 1, a unit memory cell MC may include a memory element ME and a selection element SE. The memory element ME may be provided between and connected to a bit line BL and the selection element SE, and the selection element SE may be provided between and connected to the memory element ME and a word line WL. The memory element ME may be a variable resistance device, whose resistance can be switched to one of at least two states by an electric pulse applied thereto. In an embodiment, the memory element ME may be provided to have a layered structure, whose electric resistance can be changed by a spin transfer process using an electric current passing therethrough. For example, the memory element ME may have a layered structure, which is configured to exhibit a magneto-resistance property, and may include at least one ferromagnetic material and/or at least one antiferromagnetic material. The selection element SE may be configured to selectively control a current flow of an electric current passing through the memory element ME. As an example, the selection element SE may be one of a diode, a PNP bipolar transistor, an NPN bipolar transistor, an NMOS field effect transistor, and a PMOS field effect transistor. In the case where the selection element SE is a three-terminal device (e.g., a bipolar transistor or a MOS field effect transistor), an additional interconnection line (not shown) may be connected to the selection element SE.

The memory element ME may include a magnetic tunnel junction pattern (or, magnetic tunnel junction material) MTJ. The magnetic tunnel junction pattern MTJ may include a first magnetic structure MS1, a second magnetic structure MS2, and a tunnel barrier pattern TBR therebetween. Each of the first and second magnetic structures MS1 and MS2 may include at least one magnetic layer, which is formed of a magnetic material. The memory element ME may further include a bottom electrode BE, which is interposed between the magnetic tunnel junction pattern MTJ and the selection element SE, and a top electrode TE, which is interposed between the magnetic tunnel junction pattern MTJ and the bit line BL.

Figure 2:
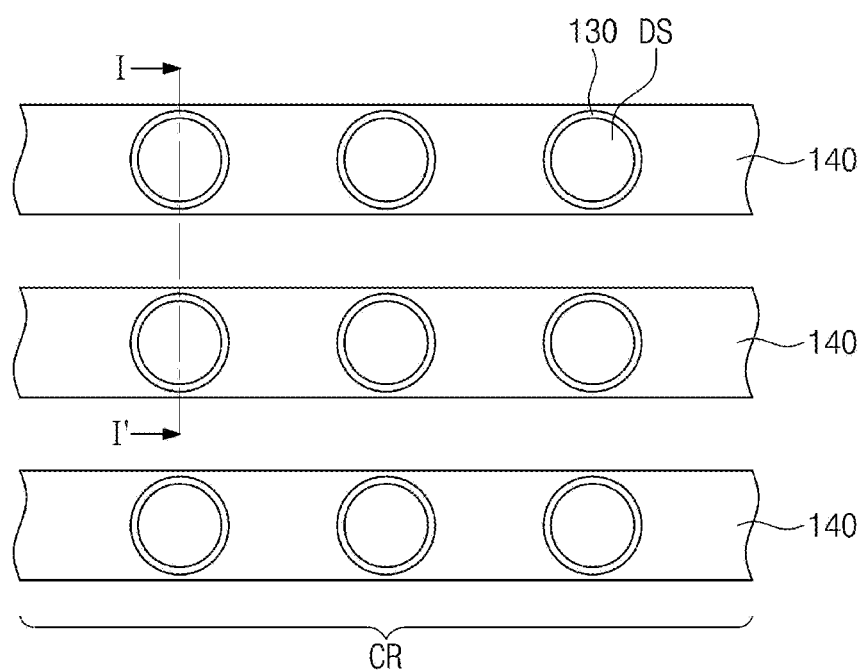
FIG. 2 is a plan view illustrating a magnetic memory device according to an embodiment of the inventive concept.
Figure 3:
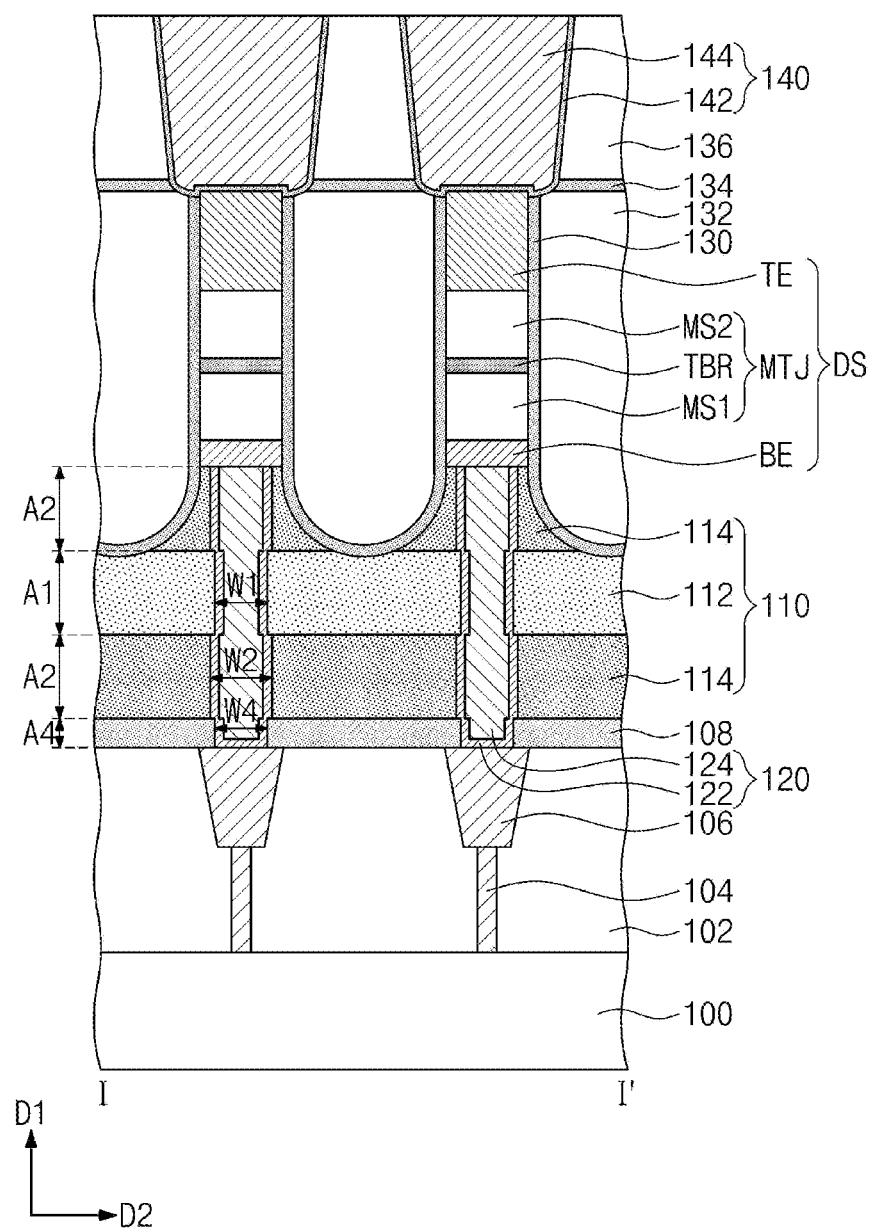
FIG. 3 is a sectional view taken along a line I-I' of FIG. 2 according to example embodiments.

FIG. 2 is a plan view illustrating a magnetic memory device according to an embodiment of the inventive concept. FIG. 3 is a sectional view taken along a line I-I' of FIG. 2 according to example embodiments.

Referring to FIGS. 2 and 3, a substrate 100 may include a cell region CR, on which memory cells are provided. The substrate 100 may be a semiconductor substrate, such as silicon, silicon-on-insulator (SOI), silicon germanium (SiGe), germanium (Ge), and gallium arsenide (GaAs) wafers.

Lower contacts 104 and lower interconnection lines 106 may be disposed on the substrate 100. The lower contacts 104 may be disposed between the substrate 100 and the lower interconnection lines 106. Each of the lower interconnection lines 106 may be electrically connected to the substrate 100 through a corresponding one of the lower contacts 104. The lower contacts 104 and the lower interconnection lines 106 may be formed of or include a metallic material (e.g., copper (Cu)).

Selection elements (not shown) may be disposed in the substrate 100. In an embodiment, the selection elements may be field effect transistors. Each of the lower interconnection lines 106 may be electrically connected to a terminal of a corresponding one of the selection elements through a corresponding one of the lower contacts 104.

A first interlayer insulating layer 102 may be disposed on the substrate 100 to cover the cell region CR and to enclose the lower contacts 104 and the lower interconnection lines 106. The lower interconnection lines 106 may have top surfaces that are substantially coplanar with that of the first interlayer insulating layer 102. For example, the top surfaces of the lower interconnection lines 106 may be located at the same level as the top surface of the first interlayer insulating layer 102. The first interlayer insulating layer 102 may be formed of or include at least one of, for example, oxide, nitride, and/or oxynitride.

A lower insulating layer 108 may be disposed on the lower interconnection lines 106 and the first interlayer insulating layer 102. The lower insulating layer 108 may cover the top surfaces of the lower interconnection lines 106 and the top surface of the first interlayer insulating layer 102.

A second interlayer insulating layer 110 may be disposed on the lower insulating layer 108. The second interlayer insulating layer 110 may include at least one first insulating pattern 112 and at least one second insulating pattern 114. The first and second insulating patterns 112 and 114 may be alternately stacked in a first direction D1 perpendicular to a top surface of the substrate 100.

The second interlayer insulating layer 110 may be formed of or include at least one of, for example, oxide, nitride, oxynitride, silicon nitride, silicon oxide, and/or silicon. The first insulating pattern 112 and the second insulating pattern 114 may be formed of or include different materials from each other. The first insulating pattern 112 may be formed of or include a material having a higher density than the second insulating pattern 114 and having a lower etch rate than the second insulating pattern 114 in a specific etching process. For example, the etch rate of the first insulating pattern 112 may be slower than 80 to 200 Å/min, and the etch rate of the second insulating pattern 114 may be faster than 200 Å/min. For example, the first insulating pattern 112 may be formed of or include tetraethyl orthosilicate (TEOS), high density plasma (HDP) oxide, silicon nitride (SiN), poly silicon (Poly Si), or the like, and the second insulating pattern 114 may be formed of or include oxide, such as high aspect ratio process (HARP) oxide, atomic layer deposition (ALD) oxide, or plasma-enhanced oxide (PEOX).

The lower insulating layer 108 may be formed of or include a material different from the first and second interlayer insulating layers 102 and 110. The lower insulating layer 108 may be formed of or include a material having an etch selectivity with respect to the first and second interlayer insulating layers 102 and 110. The lower insulating layer 108 may include a material having a slower etch rate than the first insulating pattern 112. For example, the etch rate of the lower insulating layer 108 may be slower than 70 Å/min. The lower insulating layer 108 may be formed of or include silicon carbonitride (e.g., SiCN).

A plurality of bottom electrode contacts 120 may be disposed on the substrate 100. The bottom electrode contacts 120 may be disposed on the cell region CR of the substrate 100. The bottom electrode contacts 120 may be spaced apart from each other in a second direction D2 parallel to the top surface of the substrate 100. The bottom electrode contacts 120 may be disposed in the lower insulating layer 108 and the second interlayer insulating layer 110. The bottom electrode contacts 120 may be provided to penetrate the lower insulating layer 108 and the second interlayer insulating layer 110 and may be electrically connected to a corresponding one of the lower interconnection lines 106 and the lower contacts 104. The bottom electrode contact 120 may include a bottom electrode pattern 124 and a bottom barrier pattern 122. The bottom electrode pattern 124 may be disposed in the lower insulating layer 108 and the second interlayer insulating layer 110. The bottom barrier pattern 122 may be interposed between a side surface of the bottom electrode pattern 124 and the second interlayer insulating layer 110 and between the side surface of the bottom electrode pattern 124 and the lower insulating layer 108 and may extend into a region between a bottom surface of the bottom electrode pattern 124 and a corresponding one of the lower interconnection lines 106.

The bottom electrode pattern 124 may be formed of or include at least one of doped semiconductor materials (e.g., doped silicon), metals (e.g., tungsten, titanium, tantalum, cobalt, molybdenum, and/or ruthenium), or metal-semiconductor compounds (e.g., metal silicide), and the bottom barrier pattern 122 may be formed of or include at least one of conductive metal nitrides (e.g., titanium nitride, tantalum nitride, and/or tungsten nitride).

The bottom electrode contact 120 may include a plurality of first regions A1 with a first width W1, a plurality of second regions A2 with a second width W2, and a fourth region A4 with a fourth width W4. In the present specification, the width may mean a distance between both side surfaces of the bottom electrode contact 120 measured in the second direction D2. The second region A2 may be disposed on the fourth region A4, and the first regions A1 and the second regions A2 may be alternately and repeatedly disposed on the second region A2 in the first direction D1. The first regions A1 of the bottom electrode contact 120 may be disposed in the first insulating pattern 112, the second regions A2 of the bottom electrode contact 120 may be disposed in the second insulating pattern 114, and the fourth region A4 of the bottom electrode contact 120 may be disposed in the lower insulating layer 108. The first width W1 of the bottom electrode contact 120 in the first region A1 may be different from the second width W2 of the bottom electrode contact 120 in the second region A2. For example, the first width W1 of the bottom electrode contact 120 in the first region A1 may be smaller than the second width W2 of the bottom electrode contact 120 in the second region A2. The fourth width W4 of the bottom electrode contact 120 in the fourth region A4 may be, for example, smaller than or equal to the first width W1 of the bottom electrode contact 120 in the first region A1. In this case, the bottom electrode contact 120 may be provided to have a plurality of protruding portions (i.e., the second regions A2) protruding in the second direction D2.

In an embodiment, the second interlayer insulating layer 110 may be disposed on the lower insulating layer 108. The second interlayer insulating layer 110 may include, for example, two second insulating patterns 114 and one first insulating pattern 112. The two second insulating patterns 114 may be stacked on the lower insulating layer 108. A bottom surface of the lowermost one of the second insulating patterns 114 may be in contact with the lower insulating layer 108, and a top surface of the uppermost one of the second insulating patterns 114 may be in contact with a data storing structure DS (or, the memory element ME). The first insulating pattern 112 may be disposed between the second insulating patterns 114. As described above, the first width W1 of the bottom electrode contact 120 in the first region A1 may be smaller than the second width W2 of the bottom electrode contact 120 in the second region A2. In this case, the bottom electrode contact 120 may be provided to have two protruding portions (i.e., a pair of the second regions A2) protruding in the second direction D2. The regions of the bottom electrode contact 120 described herein may also be described as sections or portions.

As an integration density of a magnetic memory device increases, a size of a bottom electrode contact decreases, and thus a conventional bottom electrode contact may suffer from extraction, melting, and/or collapse issues. However, according to an embodiment of the inventive concept, since the bottom electrode contact 120 have a plurality of protruding portions, a contact area between the bottom electrode contact 120 and the second interlayer insulating layer 110 may be increased. Accordingly, it may be possible to suppress a process failure (e.g., the extraction, melting, and/or collapse issues) in the bottom electrode contact 120 and to reduce an electric resistance of the bottom electrode contact 120. As a result, it may be possible to reduce a process failure in the magnetic memory device and to improve electric characteristics of the magnetic memory device.

The data storing structure DS may be disposed on the cell region CR of the substrate 100. In an embodiment, a plurality of the data storing structures DS may be provided to be spaced apart from each other in the second direction D2. The data storing structures DS may be disposed on the bottom electrode contacts 120, respectively, and may be connected to the bottom electrode contacts 120, respectively.

The data storing structure DS may include the bottom electrode BE, the magnetic tunnel junction pattern MTJ, and the top electrode TE, which are sequentially stacked on the bottom electrode contacts 120. The bottom electrode BE may be disposed between the bottom electrode contacts 120 and the magnetic tunnel junction pattern MTJ, and the magnetic tunnel junction pattern MTJ may be disposed between the bottom electrode BE and the top electrode TE. The magnetic tunnel junction pattern MTJ may include the first magnetic structure MS1, the second magnetic structure MS2, and the tunnel barrier pattern TBR therebetween. The first magnetic structure MS1 may be disposed between the bottom electrode BE and the tunnel barrier pattern TBR, and the second magnetic structure MS2 may be disposed between the top electrode TE and the tunnel barrier pattern TBR. The bottom electrode BE may be formed of or include at least one of, for example, conductive metal nitrides (e.g., titanium nitride (TiN) or tantalum nitride (TaN)). The top electrode TE may be formed of or include at least one of metals (e.g., Ta, W, Ru, Ir, and so forth) or conductive metal nitrides (e.g., TiN).

A bottom surface of the bottom electrode contact 120 may be in contact with a corresponding one of the lower interconnection lines 106, and a top surface of the bottom electrode contact 120 may be in contact with a bottom surface of the bottom electrode BE of the data storing structure DS.

Figure 4A:
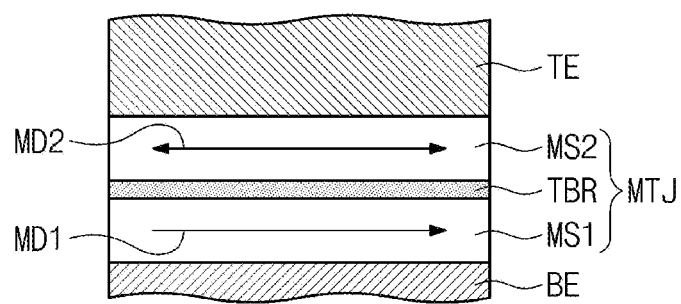
FIGS. 4A and 4B are sectional views, each of which illustrates a magnetic tunnel junction pattern of a magnetic memory device according to an embodiment of the inventive concept.
Figure 4B:
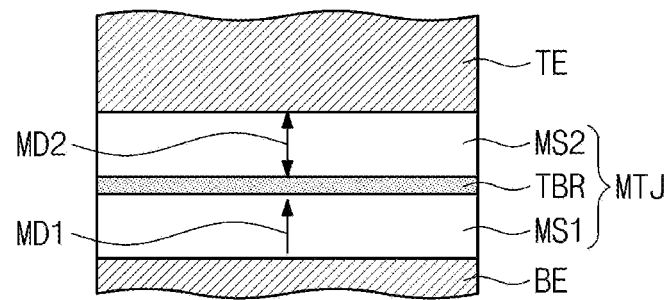

FIGS. 4A and 4B are sectional views, each of which illustrates a magnetic tunnel junction pattern of a magnetic memory device according to an embodiment of the inventive concept.

Referring to FIGS. 4A and 4B, the first magnetic structure MS1 may include a reference layer having a magnetization direction MD1, which is fixed to a specific direction, and the second magnetic structure MS2 may include a free layer having a magnetization direction MD2, which can be changed to be parallel to or anti-parallel to the magnetization direction MD1 of the first magnetic structure MS1. FIGS. 4A and 4B illustrate examples, in which the second magnetic structure MS2 includes the free layer, but the inventive concept is not limited to these examples. For example, the first and second magnetic structures MS1 and MS2 may be configured to include the free and reference layers, respectively, unlike that shown in FIGS. 4A and 4B. In an example shown in FIG. 4A, the magnetization directions MD1 and MD2 of the first and second magnetic structures MS1 and MS2 may be parallel to an interface between the tunnel barrier pattern TBR and the second magnetic structure MS2. In this case, each of the first and second magnetic structures MS1 and MS2 may include a ferromagnetic material. The first magnetic structure MS1 may further include an antiferromagnetic material, which is used to fix a magnetization direction of the ferromagnetic material in the first magnetic structure MS1. In another example shown in FIG. 4B, the magnetization directions MD1 and MD2 of the first and second magnetic structures MS1 and MS2 may be perpendicular to the interface between the tunnel barrier pattern TBR and the second magnetic structure MS2. In this case, each of the first and second magnetic structures MS1 and MS2 may include at least one of perpendicular magnetic materials (e.g., CoFeTb, CoFeGd, and CoFeDy), perpendicular magnetic materials with L10 structure, CoPt-based materials with hexagonal-close-packed structure, and perpendicular magnetic structures. The perpendicular magnetic material with the L10 structure may include at least one of L10 FePt, L10 FePd, L10 CoPd, or L10 CoPt. The perpendicular magnetic structures may include magnetic layers and non-magnetic layers that are alternatingly and repeatedly stacked. As an example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" is a natural number equal to or greater than 2.

In an embodiment, each of the first and second magnetic structures MS1 and MS2 may be formed of or include at least one of Heusler alloys. The Heusler alloys may include Co-based full-Heusler alloys. The Co-based full-Heusler alloys may include at least one of $Co_2FeSi$, $Co_2MnSi$, $Co_2FeMnSi$, $Co_2FeAl$, or $Co_2CrAl$.

The tunnel barrier pattern TBR may be formed of or include at least one of magnesium oxide, titanium oxide, aluminum oxide, magnesium-zinc oxide, or magnesium-boron oxide.

Referring back to FIGS. 2 and 3, the second interlayer insulating layer 110 on the cell region CR may have recessed regions, each of which is placed at both sides of the data storing structure DS (e.g., between the data storing structures DS) and is recessed toward the substrate 100.

A capping insulating layer 130 may cover a side surface of the data storing structure DS. The capping insulating layer 130 may be provided to enclose the side surface of the data storing structure DS, when viewed in a plan view. For example, the capping insulating layer 130 may be provided to cover the side surfaces of the bottom electrode BE, the magnetic tunnel junction pattern MTJ, and the top electrode TE or to enclose the bottom electrode BE, the magnetic tunnel junction pattern MTJ, and the top electrode TE, when viewed in a plan view. The capping insulating layer 130 may extend to conformally cover an inner surface of the recessed region of the second interlayer insulating layer 110.

A third interlayer insulating layer 132 may be disposed on the capping insulating layer 130 to cover the cell region CR. The third interlayer insulating layer 132 may cover the data storing structure DS, on the cell region CR. The capping insulating layer 130 may be interposed between the side surface of the data storing structure DS and the third interlayer insulating layer 132 and may extend into a region between the third interlayer insulating layer 132 and an inner surface of the recessed region of the second interlayer insulating layer 110 on the cell region CR.

The third interlayer insulating layer 132 may be formed of or include at least one of oxide, nitride, and/or oxynitride. The capping insulating layer 130 may be formed of or include a material different from the second interlayer insulating layer 110 and the third interlayer insulating layer 132. The capping insulating layer 130 may be formed of or include a material having an etch selectivity with respect to the second interlayer insulating layer 110 and the third interlayer insulating layer 132. For example, the capping insulating layer 130 may be formed of or include nitride (e.g., silicon nitride).

A fourth interlayer insulating layer 136 may be disposed on the third interlayer insulating layer 132, and an upper insulating layer 134 may be interposed between the third interlayer insulating layer 132 and the fourth interlayer insulating layer 136. The upper insulating layer 134 and the fourth interlayer insulating layer 136 may cover the cell region CR. The fourth interlayer insulating layer 136 may be formed of or include at least one of oxide, nitride, and/or oxynitride. The upper insulating layer 134 may be formed of or include a material different from the third interlayer insulating layer 132 and the fourth interlayer insulating layer 136. The upper insulating layer 134 may be formed of or include a material having an etch selectivity with respect to the third interlayer insulating layer 132 and the fourth interlayer insulating layer 136. For example, the upper insulating layer 134 may be formed of or include nitride (e.g., silicon nitride).

An upper interconnection line 140 may be disposed on the cell region CR of the substrate 100. In an embodiment, a plurality of the upper interconnection lines 140 may be provided to be spaced apart from each other in the second direction D2. Each of the upper interconnection lines 140 may be connected to corresponding ones of the data storing structures DS.

The upper interconnection line 140 may be provided to penetrate the upper insulating layer 134 and the fourth interlayer insulating layer 136 and may be connected to the data storing structure DS. A top surface of the top electrode TE of the data storing structure DS may be in contact with a bottom surface of the upper interconnection line 140. In an embodiment, the upper interconnection line 140 may cover the top surface of the top electrode TE and extend to cover at least a portion of the side surface of the top electrode TE. The upper interconnection line 140 may include an upper interconnection pattern 144 and an upper barrier pattern 142. The upper interconnection pattern 144 may be provided to penetrate the upper insulating layer 134 and the fourth interlayer insulating layer 136. The upper barrier pattern 142 may be interposed between a side surface of the upper interconnection pattern 144 and the fourth interlayer insulating layer 136 and between the side surface of the upper interconnection pattern 144 and the upper insulating layer 134 and may extend into a region between a bottom surface of the upper interconnection pattern 144 and the top surface of the top electrode TE. In an embodiment, the upper barrier pattern 142 may extend to cover at least a portion of the side surface of the top electrode TE. The upper interconnection pattern 144 may be formed of or include at least one of metallic materials (e.g., copper (Cu)). The upper barrier pattern 142 may be formed of or include at least one of conductive metal nitrides.

FIGS. 5, 6A, 6B, 6C, 7, 8, and 9 are sectional views, each of which illustrates a structure of bottom electrode contacts of a magnetic memory device according to an embodiment of the inventive concept.

Figure 5:
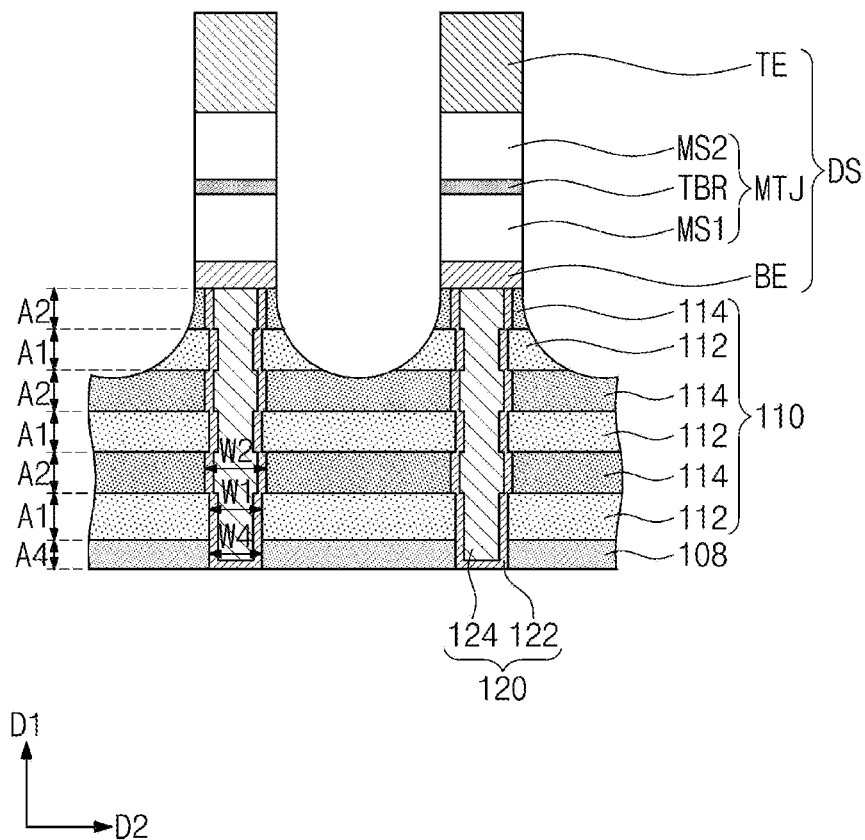
FIGS. 5, 6A, 6B, 6C, 7, 8, and 9 are sectional views, each of which illustrates a structure of bottom electrode contacts of a magnetic memory device according to an embodiment of the inventive concept.

Referring to FIG. 5, the second interlayer insulating layer 110 may be disposed on the lower insulating layer 108. The second interlayer insulating layer 110 may include three first insulating patterns 112 and three second insulating patterns 114. The first insulating pattern 112 may be in contact with the lower insulating layer 108. Three second insulating patterns 114 and two first insulating patterns 112 may be alternately stacked on the lowermost one of the first insulating patterns 112. The second insulating pattern 114 may be stacked on the uppermost one of the first insulating patterns 112, and a top surface of the uppermost one of the first insulating patterns 112 may be in contact with a bottom surface of the second insulating pattern 114. A top surface of the uppermost one of the second insulating patterns 114 may be in contact with the data storing structure DS.

The bottom electrode contact 120 may include three first regions A1 with a first width W1, three second regions A2 with a second width W2, and a fourth region A4 with a fourth width W4. The first regions A1 of the bottom electrode contact 120 may be disposed in the first insulating pattern 112, the second regions A2 of the bottom electrode contact 120 may be disposed in the second insulating pattern 114, and the fourth region A4 of the bottom electrode contact 120 may be disposed in the lower insulating layer 108. The first width W1 of the bottom electrode contact 120 in the first region A1 may be smaller than the second width W2 of the bottom electrode contact 120 in the second region A2, and the fourth width W4 of the bottom electrode contact 120 in the fourth region A4 may be smaller than or equal to the first width W1 of the bottom electrode contact 120 in the first region A1. In this case, the bottom electrode contact 120 may be provided to have three protruding portions (i.e., three second regions A2) protruding in the second direction D2. Except for the above differences, the bottom electrode contacts of the magnetic memory device according to the present embodiment may be configured to be substantially the same as those described with reference to FIGS. 3, 4A, and 4B.

Figure 6A:
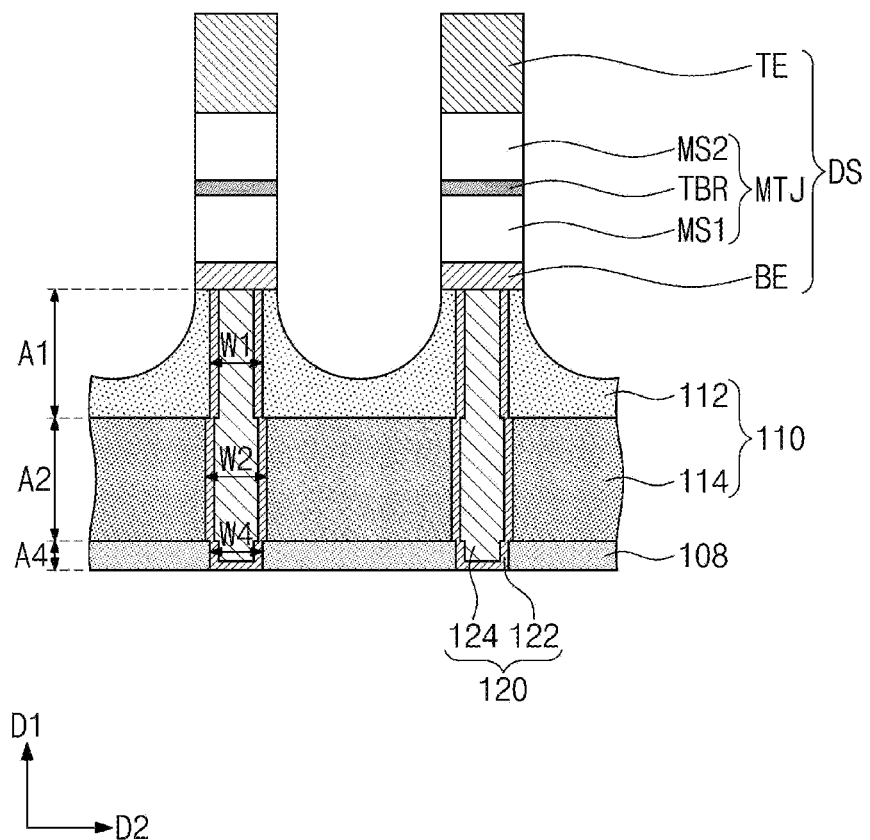

Referring to FIG. 6A, the second insulating pattern 114, the first insulating pattern 112, and the data storing structure DS may be sequentially stacked on the lower insulating layer 108. The bottom electrode contact 120 may include a first region A1 with a first width W1, a second region A2 with a second width W2, and a fourth region A4 with a fourth width W4. The first region A1 of the bottom electrode contact 120 may be disposed in the first insulating pattern 112, the second region A2 of the bottom electrode contact 120 may be disposed in the second insulating pattern 114, and the fourth region A4 of the bottom electrode contact 120 may be disposed in the lower insulating layer 108. The first width W1 of the bottom electrode contact 120 in the first region A1 may be smaller than the second width W2 of the bottom electrode contact 120 in the second region A2, and the fourth width W4 of the bottom electrode contact 120 in the fourth region A4 may be smaller than or equal to the first width W1 of the bottom electrode contact 120 in the first region A1. In this case, the bottom electrode contact 120 may be provided to have one protruding portion (i.e., the second region A2) protruding in the second direction D2. Except for the above differences, the magnetic memory device according to the present embodiment may be configured to be substantially the same as those described with reference to FIGS. 3, 4A, 4B and 5.

According to an embodiment of the inventive concept, the topmost surface of the bottom electrode contact 120 in contact with a bottom surface of the data storing structure DS may have a reduced critical dimension (CD), and this makes it possible to secure a pitch overlay margin of the magnetic tunnel junction pattern MTJ.

Figure 6B:
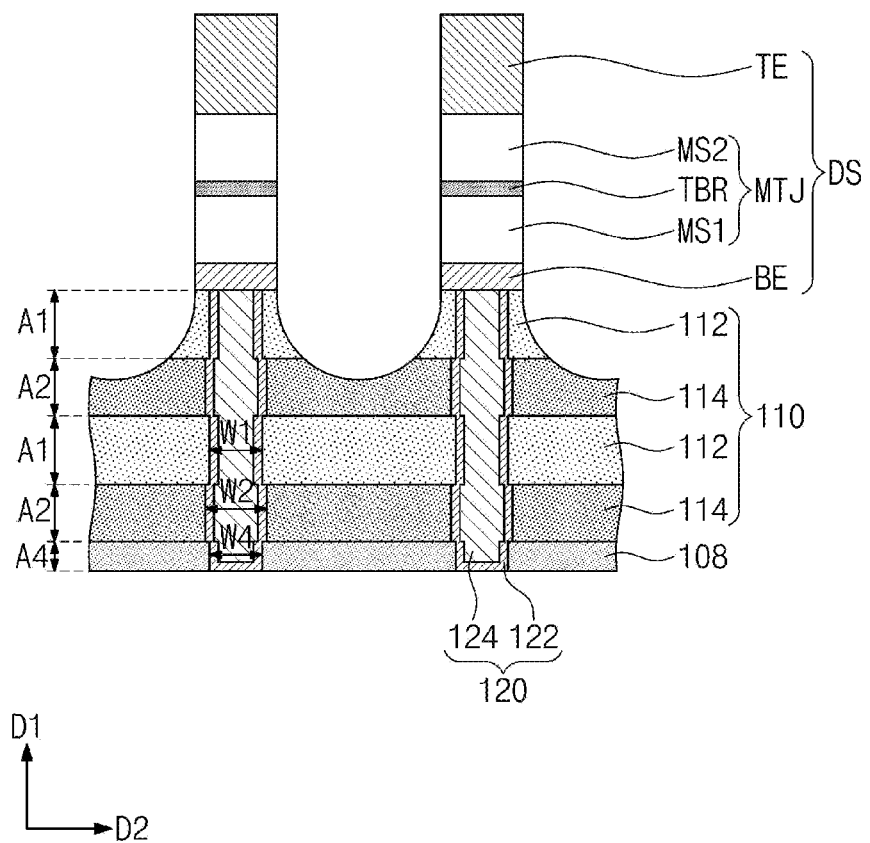

Referring to FIG. 6B, the second interlayer insulating layer 110 may be disposed on the lower insulating layer 108. The second interlayer insulating layer 110 may include two second insulating patterns 114 and two first insulating patterns 112. The second insulating pattern 114 may be in contact with the lower insulating layer 108. A pair of the first insulating patterns 112 and the second insulating pattern 114 interposed therebetween may be stacked on the lowermost one of the second insulating patterns 114. A top surface of the uppermost one of the first insulating patterns 112 may be in contact with the data storing structure DS.

The bottom electrode contact 120 may include two first regions A1 with a first width W1, two second regions A2 with a second width W2, and a fourth region A4 with a fourth width W4. The first regions A1 of the bottom electrode contact 120 may be disposed in the first insulating pattern 112, the second regions A2 of the bottom electrode contact 120 may be disposed in the second insulating pattern 114, and the fourth region A4 of the bottom electrode contact 120 may be disposed in the lower insulating layer 108. The first width W1 of the bottom electrode contact 120 in the first region A1 may be smaller than the second width W2 of the bottom electrode contact 120 in the second region A2, and the fourth width W4 of the bottom electrode contact 120 in the fourth region A4 may be smaller than or equal to the first width W1 of the bottom electrode contact 120 in the first region A1. In this case, the bottom electrode contact 120 may be provided to have two protruding portions (i.e., a pair of the second regions A2) protruding in the second direction D2. Except for the above differences, the magnetic memory device according to the present embodiment may be configured to be substantially the same as those described with reference to FIG. 6A.

Figure 6C:
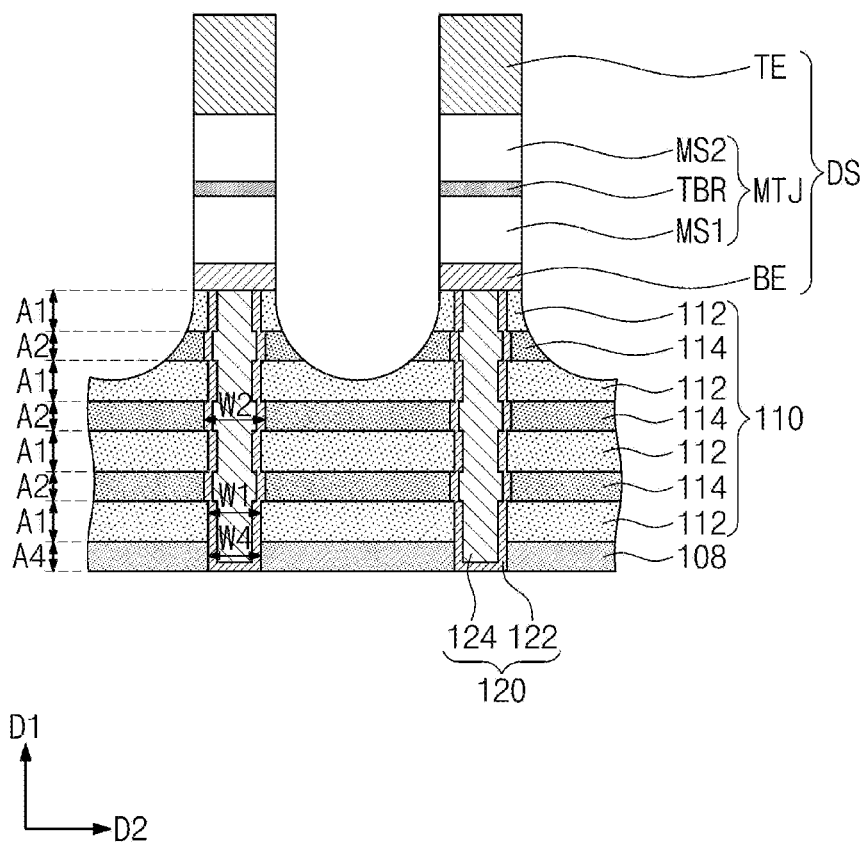

Referring to FIG. 6C, the second interlayer insulating layer 110 may be disposed over the lower insulating layer 108. The second interlayer insulating layer 110 may include four first insulating patterns 112 and three second insulating patterns 114. The first insulating pattern 112 may be in contact with the lower insulating layer 108. Three second insulating patterns 114 and three first insulating patterns 112 may be alternately stacked on the lowermost one of the first insulating patterns 112. A top surface of the uppermost one of the first insulating patterns 112 may be in contact with the data storing structure DS.

The bottom electrode contact 120 may include four first regions A1 with a first width W1, three second regions A2 with a second width W2, and a fourth region A4 having a fourth width W4. The first regions A1 of the bottom electrode contact 120 may be disposed in the first insulating pattern 112, the second regions A2 of the bottom electrode contact 120 may be disposed in the second insulating pattern 114, and the fourth region A4 of the bottom electrode contact 120 may be disposed in the lower insulating layer 108. The first width W1 of the bottom electrode contact 120 in the first region A1 may be smaller than the second width W2 of the bottom electrode contact 120 in the second region A2, and the fourth width W4 of the bottom electrode contact 120 in the fourth region A4 may be smaller than or equal to the first width W1 of the bottom electrode contact 120 in the first region A1. In this case, the bottom electrode contact 120 may be provided to have three protruding portions (i.e., three second regions A2) protruding in the second direction D2. Except for the above differences, the magnetic memory device according to the present embodiment may be configured to be substantially the same as those described with reference to FIG. 6A.

Figure 7:
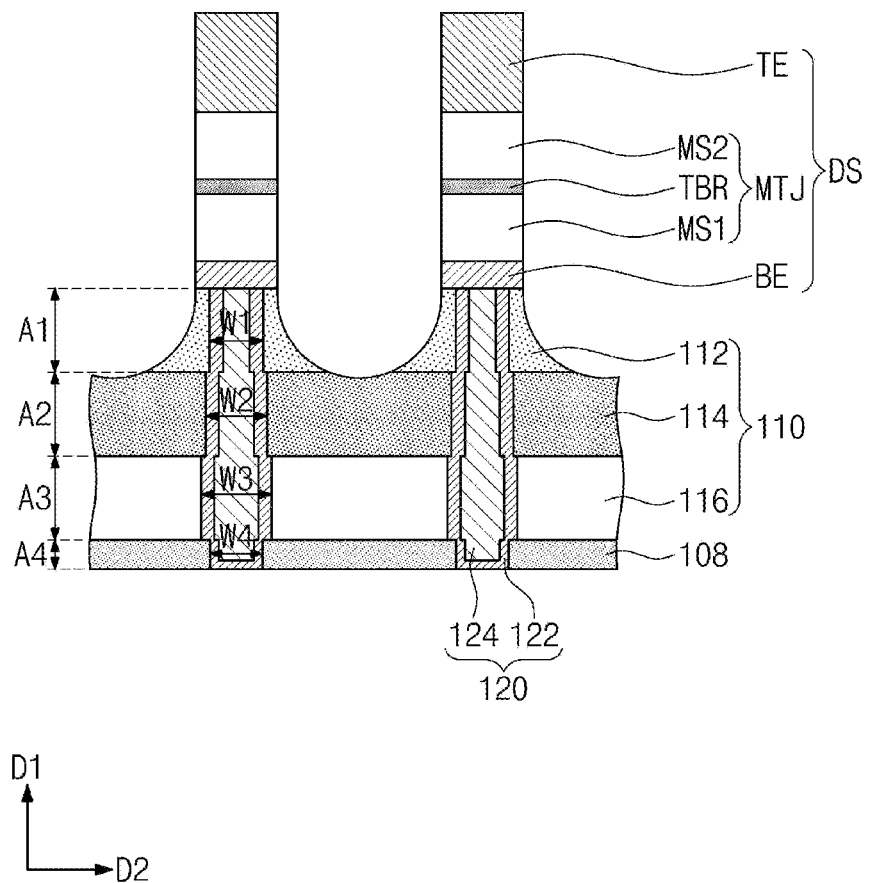

Referring to FIG. 7, the second interlayer insulating layer 110 may be disposed on the lower insulating layer 108. The second interlayer insulating layer 110 may include at least one first insulating pattern 112, at least one second insulating pattern 114, and at least one third insulating pattern 116. The third insulating pattern 116, the second insulating pattern 114, the first insulating pattern 112, and the data storing structure DS may be sequentially stacked on the lower insulating layer 108. The second interlayer insulating layer 110 may be formed of or include at least one of oxide, nitride, oxynitride, silicon nitride, and/or silicon. In an embodiment, the first insulating pattern 112, the second insulating pattern 114, and the third insulating pattern 116 may be formed of or include different materials from each other. The first insulating pattern 112 may be formed of or include a material having a higher density than the second insulating pattern 114 and having a lower etch rate than the second insulating pattern 114 in a specific etching process. The third insulating pattern 116 may be formed of or include a material having a lower density than the second insulating pattern 114 and having a higher etch rate than the second insulating pattern 114 in a specific etching process. For example, the etch rate of the first insulating pattern 112 may be slower than 80 Å/min, the etch rate of the second insulating pattern 114 may be slower than 80 to 200 Å/min, and the etch rate of the third insulating pattern 116 may be faster than 200 Å/min. For example, the first insulating pattern 112 may be formed of or include at least one of silicon nitride (SiN) or poly silicon (Poly Si), the second insulating pattern 114 may be formed of or include at least one of tetraethyl orthosilicate (TEOS) or high density plasma (HDP) oxide, and the third insulating pattern 116 may be formed of or include at least one of high aspect ratio process (HARP) oxide, atomic layer deposition (ALD) oxide, or plasma-enhanced oxide (PEOX).

The bottom electrode contacts 120 may be disposed in the lower insulating layer 108 and the second interlayer insulating layer 110. The bottom electrode contact 120 may include a first region A1, a second region A2, a third region A3, and a fourth region A4. The first region A1, the second region A2, and the third region A3 may be sequentially disposed on the fourth region A4 in the first direction D1. The first region A1 of the bottom electrode contact 120 may be disposed in the first insulating pattern 112. The second region A2 of the bottom electrode contact 120 may be disposed in the second insulating pattern 114. The third region A3 of the bottom electrode contact 120 may be disposed in the third insulating pattern 116. The fourth region A4 of the bottom electrode contact 120 may be disposed in the lower insulating layer 108. A first width W1 of the bottom electrode contact 120 in the first region A1, a second width W2 of the bottom electrode contact 120 in the second region A2, and a third width W3 of the bottom electrode contact 120 in the third region A3 may be different from each other. For example, the first width W1 of the bottom electrode contact 120 in the first region A1 may be smaller than the second width W2 of the bottom electrode contact 120 in the second region A2, and the third width W3 of the bottom electrode contact 120 in the third region A3 may be larger than the second width W2 of the bottom electrode contact 120 in the second region A2. In addition, a fourth width W4 of the bottom electrode contact 120 in the fourth region A4 may be smaller than or equal to the first width W1 of the bottom electrode contact 120 in the first region A1. Except for the above differences, the magnetic memory device according to the present embodiment may be configured to be substantially the same as those described with reference to FIGS. 3, 4A, 4B and 5.

Figure 8:
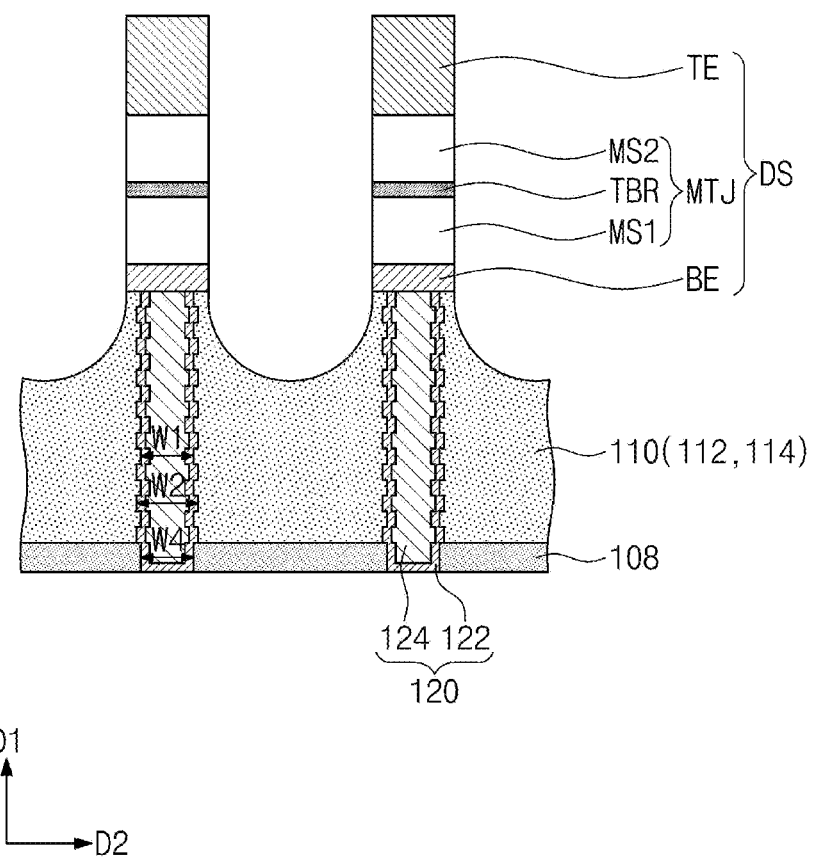

Referring to FIG. 8, the second interlayer insulating layer 110 and the data storing structure DS may be sequentially stacked on the lower insulating layer 108. Even though not shown, the second interlayer insulating layer 110 may include n first insulating patterns 112 and m second insulating patterns 114 alternately stacked on the lower insulating layer 108. Here, n and m are natural numbers that are greater than or equal to 1 and are the same as or different from each other. The bottom electrode contact 120 may include n first regions A1 each having a first width W1, m second regions A2 each having a second width W2, and a fourth region A4 having a fourth width W4. For example, the first width W1 of the bottom electrode contact 120 in the first region A1 may be smaller than the second width W2 of the bottom electrode contact 120 in the second region A2. In this case, the bottom electrode contact 120 may be provided to have m protruding portions (i.e., the second regions A2) protruding in the second direction D2. In some examples, the fourth width W4 of the bottom electrode contact 120 in the fourth region A4 may be smaller than or equal to the first width W1 of the bottom electrode contact 120 in the first region A1. Except for the above differences, the magnetic memory device according to the present embodiment may be configured to be substantially the same as those described with reference to FIGS. 3, 4A, 4B and 5.

Figure 9:
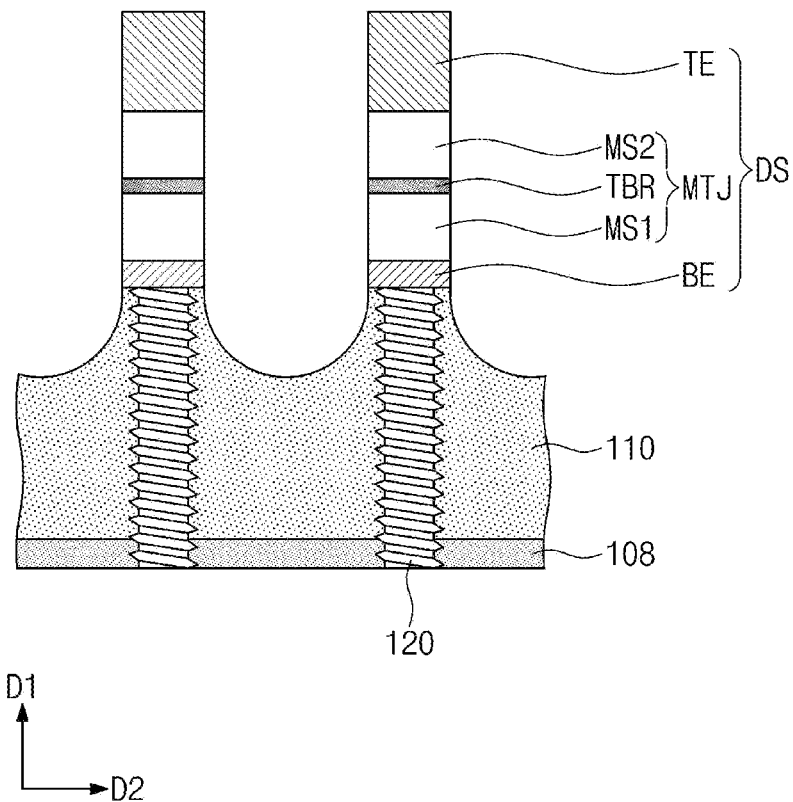

Referring to FIG. 9, the second interlayer insulating layer 110 and the data storing structure DS may be sequentially stacked on the lower insulating layer 108. The bottom electrode contact 120 may be provided to have a plurality of thread-like portions or to have a screw-shaped structure.

In some examples, even though not shown, the second interlayer insulating layer 110 may include a plurality of first insulating patterns 112 and a plurality of second insulating patterns 114 alternately stacked on the lower insulating layer 108.

In some examples, even though not shown, the bottom electrode contact 120 may include a bottom electrode pattern 124 and a bottom barrier pattern 122. The bottom electrode pattern 124 may be disposed in the lower insulating layer 108 and the second interlayer insulating layer 110. The bottom barrier pattern 122 may be interposed between a side surface of the bottom electrode pattern 124 and the second interlayer insulating layer 110 and between the side surface of the bottom electrode pattern 124 and the lower insulating layer 108 and may extend into a region between a bottom surface of the bottom electrode pattern 124 and a top surface of a corresponding one of the lower interconnection lines 106.

In some examples, the bottom electrode contact 120 may include only the bottom electrode pattern 124.

In example embodiments, a contact area between the bottom electrode contact 120 and the second interlayer insulating layer 110 may be increased, due to the plurality of protruding portions of the bottom electrode contact 120. Accordingly, it may be possible to suppress a process failure (e.g., the extraction, melting, and/or collapse issues) in the bottom electrode contact 120 and to reduce an electric resistance of the bottom electrode contact 120. As a result, it may be possible to reduce a process failure in the magnetic memory device and to improve electric characteristics of the magnetic memory device.

FIGS. 10 to 15 are sectional views taken along the line I-I' of FIG. 2 to illustrate a method of fabricating a magnetic memory device, according to an embodiment of the inventive concept. For the sake of brevity, an element previously described with reference to FIGS. 1 to 3, 4A, 4B, 5, 6A to 6C, and 7 to 9 may be identified by the same reference number without repeating an overlapping description thereof.

Figure 10:
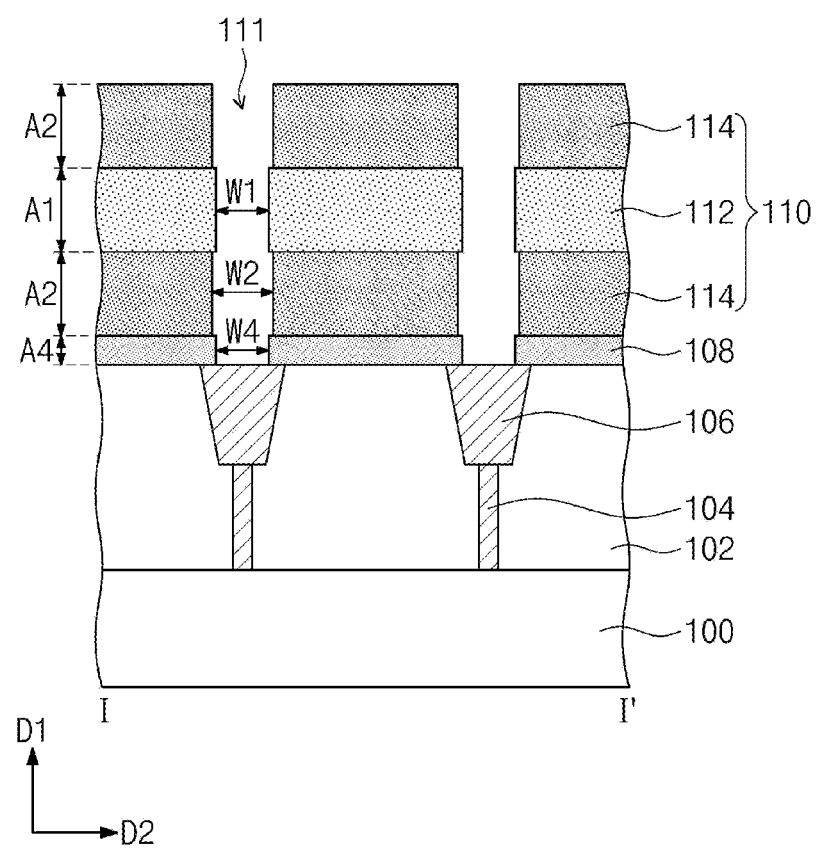
FIGS. 10 to 15 are sectional views taken along the line I-I' of FIG. 2 to illustrate a method of fabricating a magnetic memory device, according to an embodiment of the inventive concept.

Referring to FIG. 10, the substrate 100 including the cell region CR may be provided. Selection elements (not shown) may be formed on or in the substrate 100, and the first interlayer insulating layer 102 may be formed on the substrate 100. The lower interconnection lines 106 and the lower contacts 104 may be formed on the cell region CR of the substrate 100 to penetrate the first interlayer insulating layer 102 and to be connected to the selection elements. The lower interconnection lines 106 may be formed to have top surfaces that are coplanar with a top surface of the first interlayer insulating layer 102.

The lower insulating layer 108 may be formed on the first interlayer insulating layer 102. The second interlayer insulating layer 110 may be formed on the lower insulating layer 108. The second interlayer insulating layer 110 may include a plurality of first insulating patterns 112 and a plurality of second insulating patterns 114. The second insulating patterns 114 and the first insulating patterns 112 may be alternately stacked on the lower insulating layer 108. The second insulating patterns 114 and the first insulating patterns 112 may include, for example, oxide, nitride, oxynitride, silicon nitride, and/or silicon. The first insulating pattern 112 and the second insulating pattern 114 may be formed of or include different materials from each other. The first insulating pattern 112 may be formed of or include a material having a higher density and a lower etch rate than those of the second insulating pattern 114.

An etching process may be performed on the second interlayer insulating layer 110. For example, the etching process maybe a wet etching process. The etching process may be performed to expose the side surfaces of the first and second insulating patterns 112 and 114. A cleaning process using HF or the like may be performed after the etching process. Due to a difference in etch rate between the first and second insulating patterns 112 and 114, the first and second insulating patterns 112 and 114 may be etched in different etching amounts. For example, an etching depth of the first insulating pattern 112 may be different from that of the second insulating pattern 114, when measured in the second direction D2. For example, the first insulating pattern 112 including a material of a relatively slow etch rate may have a smaller etching amount than the second insulating pattern 114 including a material of a relatively fast etch rate. In this case, the etching depth of the first insulating pattern 112 in the second direction D2 may be smaller than that of the second insulating pattern 114. Thus, after the cleaning process, a trench 111 with a plurality of protruding portions may be formed in the first insulating pattern 112, the second insulating pattern 114, and the lower insulating layer 108. The trench 111 may include the first regions A1 with the first width W1, the second regions A2 with the second width W2, and the fourth region A4 with the fourth width W4. The second region A2 may be disposed on the fourth region A4, and the first regions A1 and the second regions A2 may be alternately and repeatedly disposed on the second region A2 in the first direction D1. The first regions A1 of the trench 111 may be formed in the first insulating pattern 112, the second regions A2 of the trench 111 may be formed in the second insulating pattern 114, and the fourth region A4 of the trench 111 may be formed in the lower insulating layer 108. The first width W1 of the trench 111 in the first region A1 may be different from the second width W2 of the trench 111 in the second region A2. For example, the first width W1 of the trench 111 in the first region A1 may be smaller than the second width W2 of the trench 111 in the second region A2. In addition, the fourth width W4 of the bottom electrode contact 120 in the fourth region A4 may be smaller than or equal to the first width W1 of the bottom electrode contact 120 in the first region A1. For example, the trench 111 may be formed to include a plurality of protruding portions (i.e., the second regions A2) protruding in the second direction D2.

Figure 11:
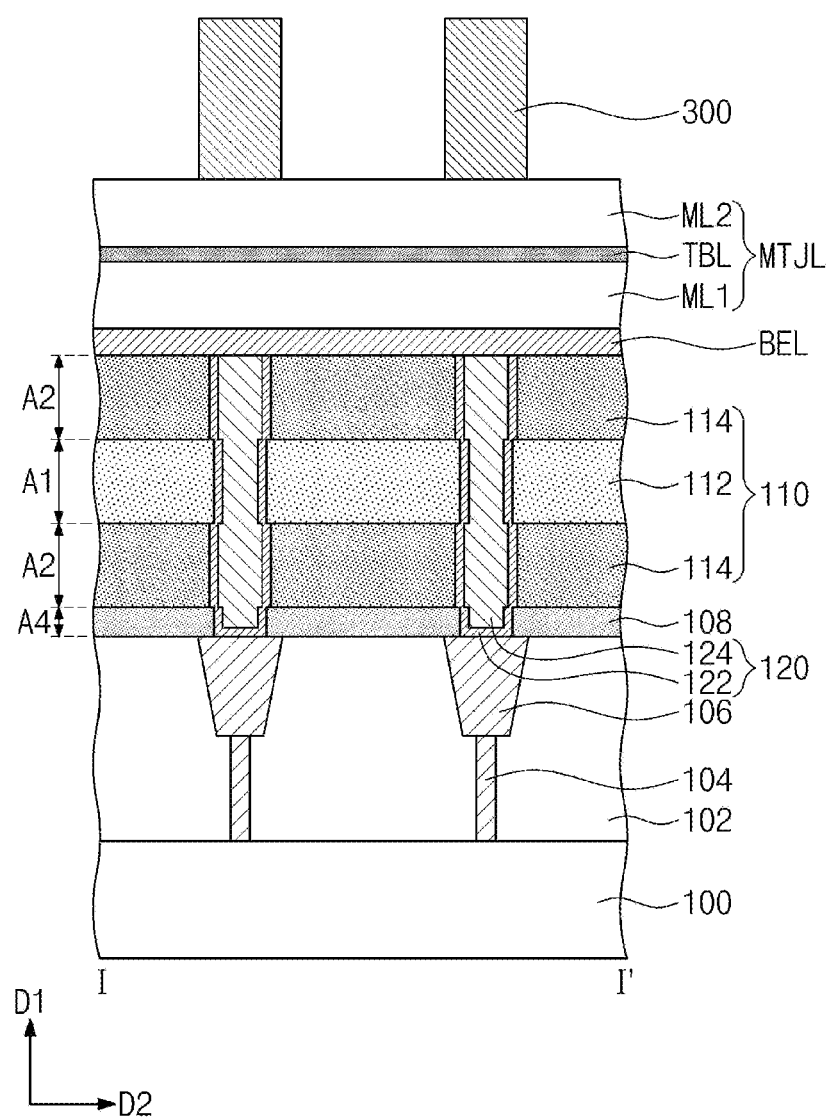

Referring to FIG. 11, the bottom electrode contact 120 may be formed in the trench 111 including the protruding portions. The bottom electrode contact 120 may be formed to penetrate the second interlayer insulating layer 110 and the lower insulating layer 108 and may be electrically connected to a corresponding one of the lower interconnection lines 106. The formation of the bottom electrode contact 120 may include sequentially forming a bottom barrier layer and a lower contact layer to fill the trench 111 and planarizing the bottom barrier layer and the lower contact layer to expose the top surface of the second interlayer insulating layer 110. As a result of the planarization process, the bottom barrier pattern 122 and the bottom electrode pattern 124 may be formed in the trench 111. For example, the bottom electrode contact 120 may continuously extend between the topmost surface of the second interlayer insulating layer 110 and the bottommost surface of the lower insulating layer 108.

A bottom electrode layer BEL and a magnetic tunnel junction layer MTJL may be sequentially formed on the second interlayer insulating layer 110. The bottom electrode layer BEL may be formed to cover an exposed top surface of the bottom electrode contact 120 and the exposed top surface of the second interlayer insulating layer 110. The magnetic tunnel junction layer MTJL may include a first magnetic layer ML1, a tunnel barrier layer TBL, and a second magnetic layer ML2, which are sequentially stacked on the bottom electrode layer BEL. Each of the first and second magnetic layers ML1 and ML2 may include at least one magnetic layer. Each of the first magnetic layer ML1, the tunnel barrier layer TBL, and the second magnetic layer ML2 may be formed by one of sputtering, chemical vapor deposition, or atomic layer deposition processes.

A conductive mask pattern 300 may be formed on the magnetic tunnel junction layer MTJL and in the cell region CR. The conductive mask pattern 300 may define a position and shape of a region, on which a magnetic tunnel junction pattern will be formed. In an embodiment, the conductive mask pattern 300 may be formed of or include at least one of metallic materials (e.g., Ta, W, Ru, Ir, and so forth) or conductive metal nitrides (e.g., TiN).

Figure 12:
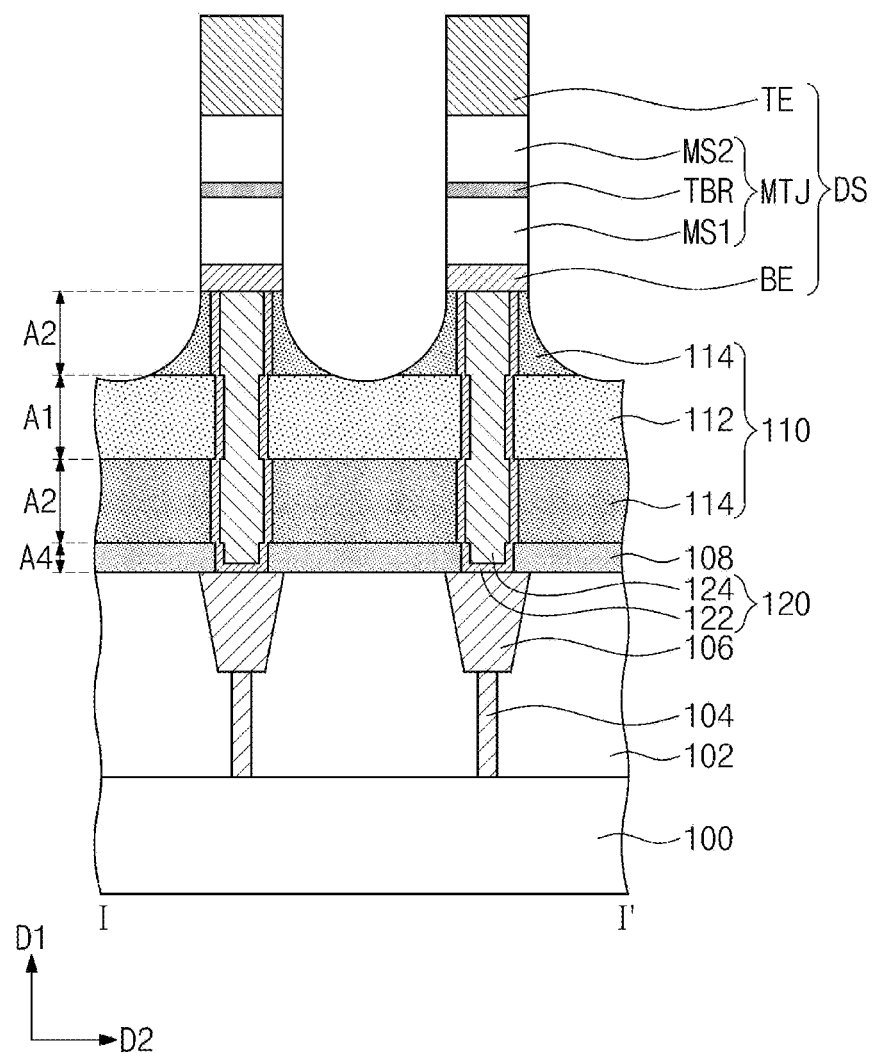

Referring to FIG. 12, the magnetic tunnel junction layer MTJL and the bottom electrode layer BEL may be sequentially etched using the conductive mask pattern 300 as an etch mask. Accordingly, the magnetic tunnel junction pattern MTJ and the bottom electrode BE may be formed on the second interlayer insulating layer 110 and in the cell region CR. The bottom electrode BE may be connected to the bottom electrode contact 120, and the magnetic tunnel junction pattern MTJ may be formed on the bottom electrode BE. The magnetic tunnel junction pattern MTJ may include the first magnetic structure MS1, the tunnel barrier pattern TBR, and the second magnetic structure MS2, which are sequentially stacked on the bottom electrode BE. The first and second magnetic structures MS1 and MS2 may be spaced apart from each other with the tunnel barrier pattern TBR interposed therebetween. The etching of the magnetic tunnel junction layer MTJL may include sequentially etching the second magnetic layer ML2, the tunnel barrier layer TBL, and the first magnetic layer ML1 using the conductive mask pattern 300 as an etch mask. The second magnetic structure MS2, the tunnel barrier pattern TBR, and the first magnetic structure MS1 may be respectively formed, as a result of the etching of the second magnetic layer ML2, the tunnel barrier layer TBL, and the first magnetic layer ML1.

In an embodiment, the process of etching the magnetic tunnel junction layer MTJL and the bottom electrode layer BEL may be an ion beam etching process, in which an ion beam is used. The ion beam may include inert ions. As a result of the etching process, upper portions of the second interlayer insulating layer 110 may be recessed at both sides of the magnetic tunnel junction pattern MTJ. Thus, the second interlayer insulating layer 110 on the cell region CR may have recessed regions that are formed at both sides of the magnetic tunnel junction pattern MTJ and are recessed toward the substrate 100. The lowermost surface of the recessed region may be located at a level that is lower than a top surface of the bottom electrode contact 120.

After the etching process, a portion of the conductive mask pattern 300 may be left on the magnetic tunnel junction pattern MTJ. The remainder of the conductive mask pattern 300 may serve as the top electrode TE. Hereinafter, the remainder of the conductive mask pattern 300 may be referred to as the top electrode TE. In an embodiment, the top electrode TE, the magnetic tunnel junction pattern MTJ, and the bottom electrode BE may constitute the data storing structure DS.

Figure 13:
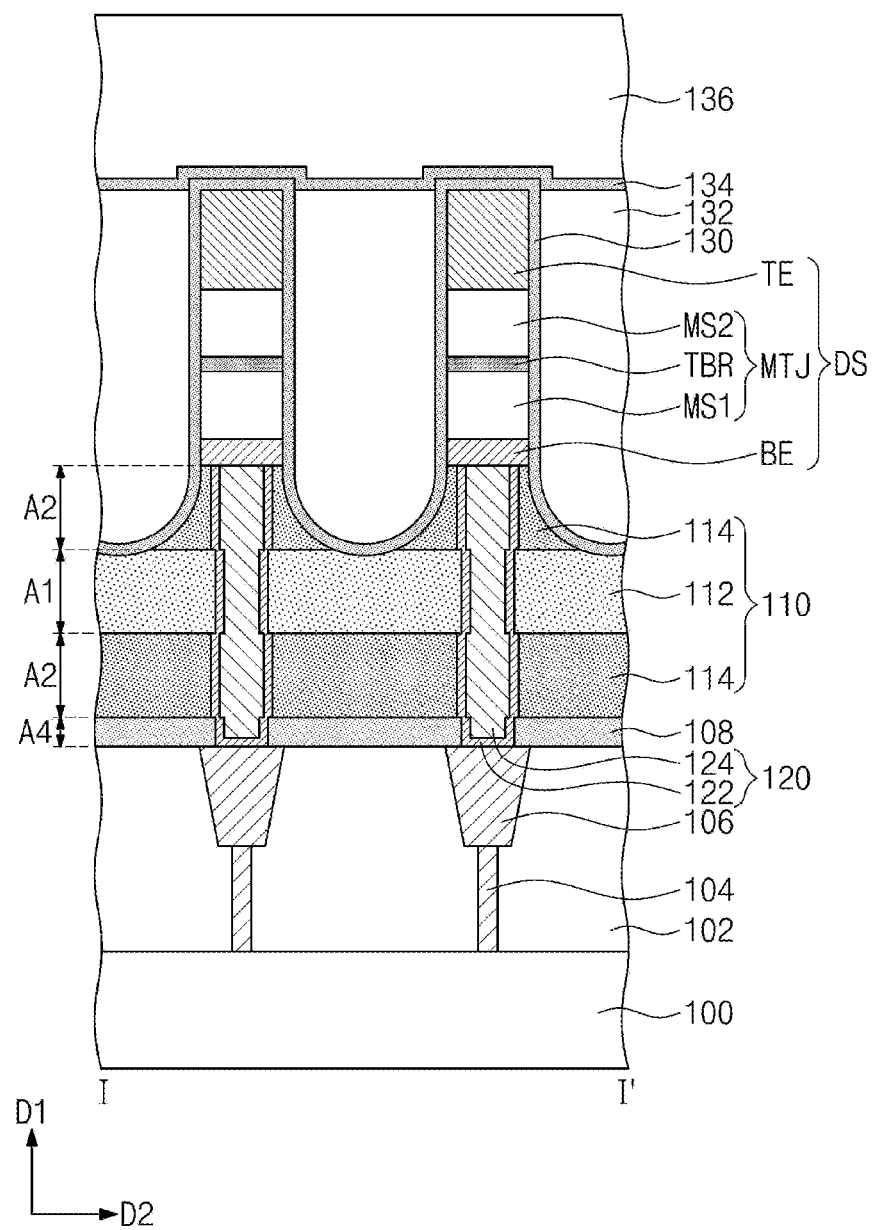

Referring to FIG. 13, the capping insulating layer 130 may be formed on the second interlayer insulating layer 110 to cover the data storing structure DS. The capping insulating layer 130 may be formed to cover top and side surfaces of the data storing structure DS and an inner surface of the recessed region of the second interlayer insulating layer 110. In an embodiment, the capping insulating layer 130 may conformally cover the top and side surfaces of the data storing structure DS.

The third interlayer insulating layer 132 may be formed on the capping insulating layer 130 to cover the data storing structure DS. The upper insulating layer 134 and the fourth interlayer insulating layer 136 may be sequentially formed on the third interlayer insulating layer 132. The upper insulating layer 134 may be interposed between the third interlayer insulating layer 132 and the fourth interlayer insulating layer 136. Each of the first and second interlayer insulating layers 102 and 110, the third and fourth interlayer insulating layers 132 and 136, the lower insulating layer 108, the capping insulating layer 130, and the upper insulating layer 134 may be formed by one of chemical vapor deposition, physical vapor deposition, or atomic layer deposition processes.

Figure 14:
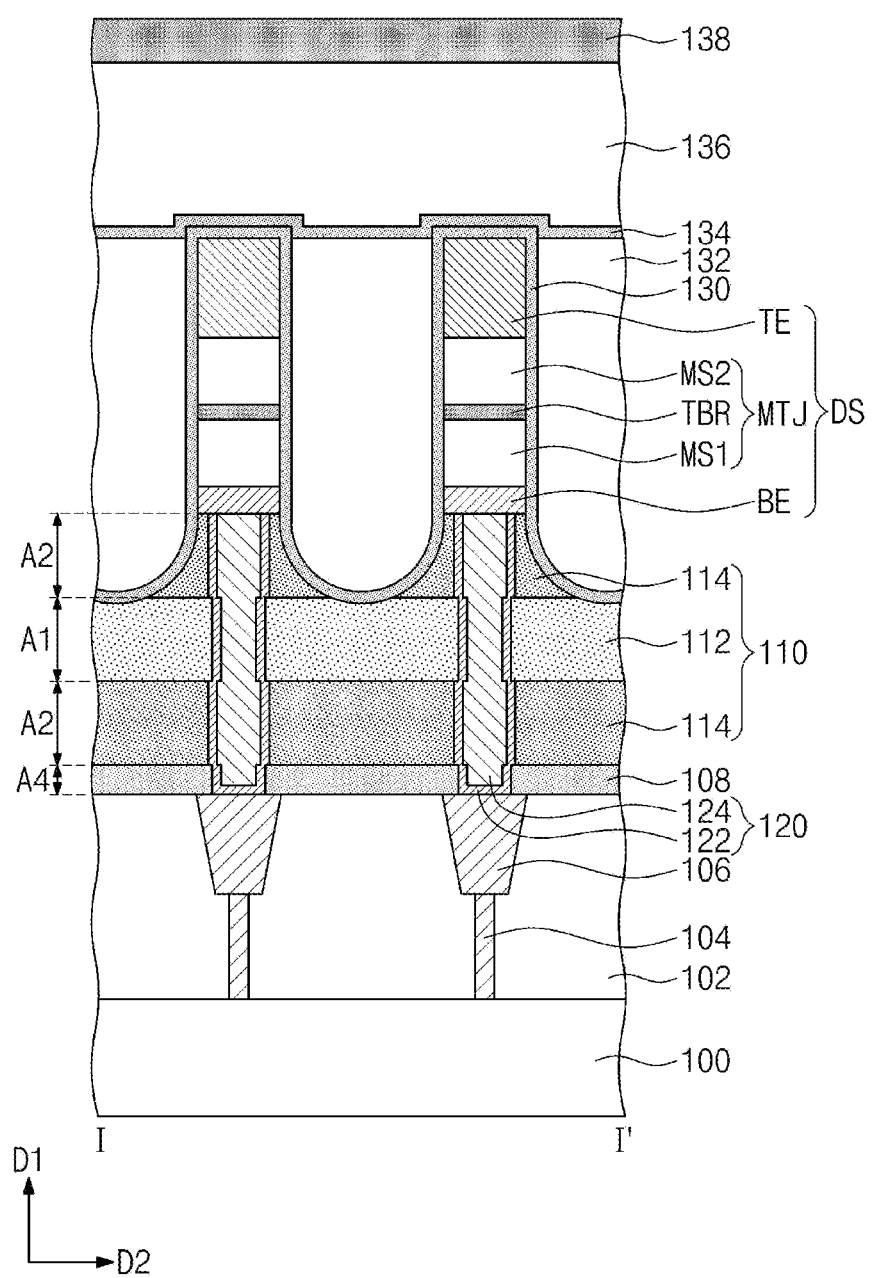

Referring to FIG. 14, a sacrificial layer 138 may be formed on the fourth interlayer insulating layer 136. The sacrificial layer 138 may cover the fourth interlayer insulating layer 136 on the cell region CR. In an embodiment, the sacrificial layer 138 may be formed of or include a carbon-containing material.

Figure 15:
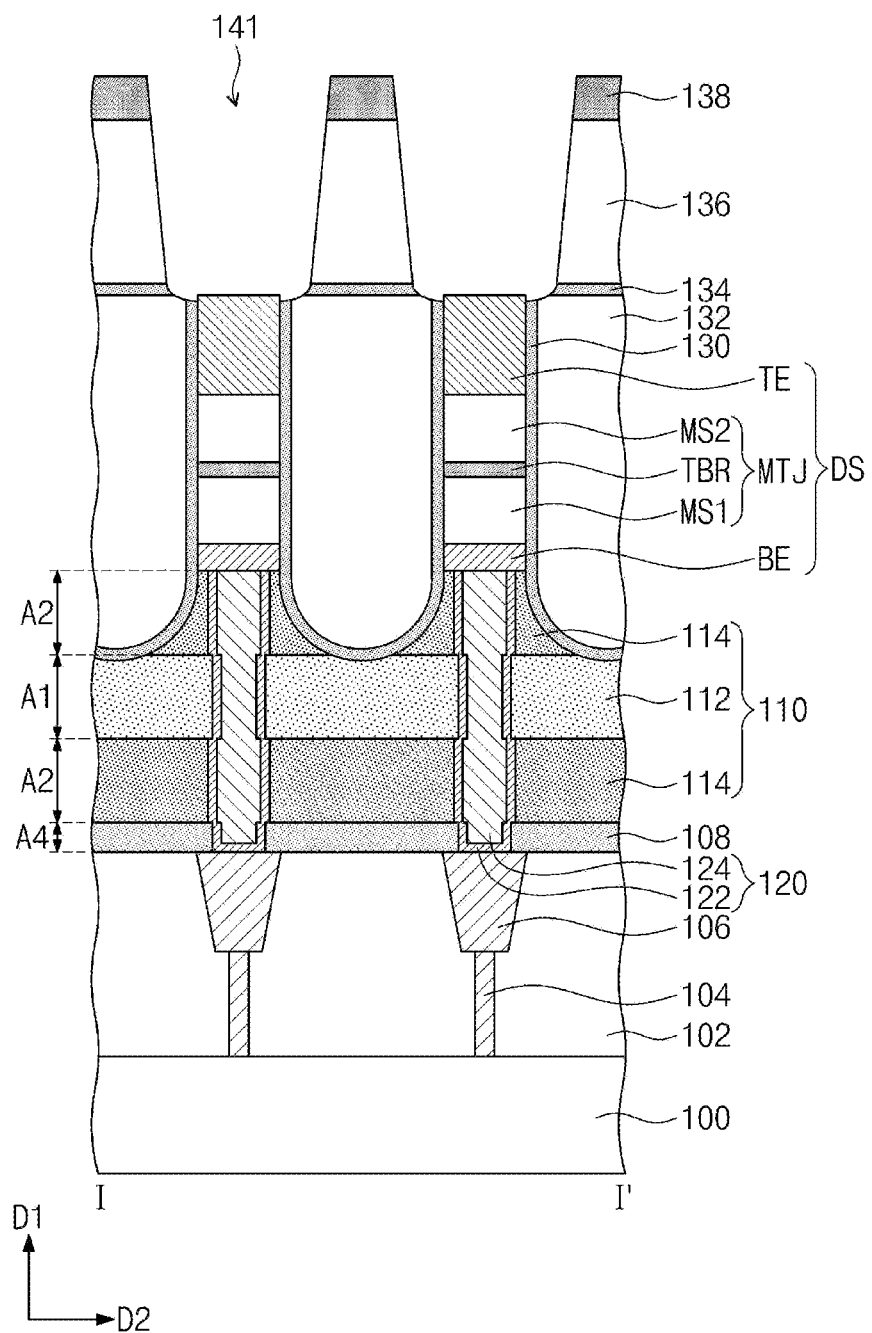

Referring to FIG. 15, a first etching process may be performed to pattern the sacrificial layer 138, the fourth interlayer insulating layer 136, and the upper insulating layer 134 on the cell region CR, and thus, a cell trench 141 may be formed in the fourth interlayer insulating layer 136 and on the cell region CR. The first etching process may be performed to expose the capping insulating layer 130 on the cell region CR. For example, the cell trench 141 may be formed to expose a top surface of the capping insulating layer 130 on the cell region CR. During the first etching process, an etch rate of the sacrificial layer 138 may be faster than an etch rate of each of the fourth interlayer insulating layer 136, the upper insulating layer 134, the third interlayer insulating layer 132, the capping insulating layer 130, and the second interlayer insulating layer 110. As a result of the first etching process on the sacrificial layer 138, a top surface of the fourth interlayer insulating layer 136 on the cell region CR may be exposed to the outside during the first etching process.

A second etching process may be performed to etch a portion of the capping insulating layer 130 exposed by the cell trench 141. Thus, the cell trench 141 may be formed to expose the top surface of the top electrode TE, and in an embodiment, the second etching process may be performed to form the cell trench 141 exposing a side surface of the top electrode TE.

Referring back to FIGS. 2 and 3, the upper interconnection lines 140 may be formed in the cell trenches 141, respectively. The upper interconnection line 140 may include the upper interconnection pattern 144 and the upper barrier pattern 142, which is extended along the side and bottom surfaces of the upper interconnection pattern 144.

The formation of the upper interconnection line 140 may include forming a barrier layer on the fourth interlayer insulating layer 136 to fill a portion of the cell trench 141, forming a conductive layer on the barrier layer to fill a remaining space of the cell trench 141, and planarizing the conductive layer and the barrier layer to expose a top surface of the fourth interlayer insulating layer 136. The barrier layer may be formed to conformally cover an inner surface of the cell trench 141. The barrier layer may be formed of or include at least one of conductive metal nitrides, and the conductive layer may be formed of or include at least one of metallic materials (e.g., copper). As a result of the planarization process, a top surface of the upper interconnection pattern 144 and the topmost surface of the upper barrier pattern 142 may be substantially coplanar with the top surface of the fourth interlayer insulating layer 136 on the cell region CR.

According to an embodiment of the inventive concept, a bottom electrode contact may be provided to have a plurality of protruding portions, and thus, a contact area between the bottom electrode contact and an insulating layer may be increased. Accordingly, it may be possible to suppress a process failure (e.g., extraction, melting, and/or collapse issues) in the bottom electrode contact and to reduce an electrical resistance of the bottom electrode contact. As a result, a magnetic memory device with improved electric characteristics and less process failure and a method of fabricating the same may be provided.

While example embodiments of the inventive concept have been particularly shown and described, it will be understood by one of ordinary skill in the art that variations in form and detail may be made therein without departing from the spirit and scope of the attached claims.

What is claimed is:
1. A magnetic memory device, comprising:
   a lower interlayer insulating layer on a substrate;
   a bottom electrode contact disposed in the lower interlayer insulating layer; and
   a magnetic tunnel junction pattern on the bottom electrode contact, wherein the bottom electrode contact comprises a second region and a first region, which are sequentially disposed in a first direction perpendicular to a top surface of the substrate so that the second region is between the first region and the top surface of the substrate, wherein a first width of the first region of the bottom electrode contact is smaller than a second width of the second region of the bottom electrode contact, when measured in a second direction parallel to the top surface of the substrate, and wherein the bottom electrode contact further comprises a third region having the second width and stacked on the first region.

2. The magnetic memory device of claim 1, wherein the lower interlayer insulating layer comprises a first insulating pattern and a second insulating pattern, which are sequentially stacked on the substrate, wherein the first region of the bottom electrode contact is disposed in the first insulating pattern, wherein the second region of the bottom electrode contact is disposed in the second insulating pattern, and wherein the first insulating pattern and the second insulating pattern comprise different materials from each other.

3. The magnetic memory device of claim 2, wherein the first insulating pattern comprises a material having a slower etch rate than the second insulating pattern in a specific etching process.

4. The magnetic memory device of claim 1, wherein the bottom electrode contact further comprises a plurality regions having the first width and a plurality of regions having the second width, and wherein the plurality of regions having the first width and the plurality of regions having the second width are alternately disposed in the first direction.

5. The magnetic memory device of claim 1, further comprising:

a lower interconnection line disposed between the substrate and the bottom electrode contact and electrically connected to the bottom electrode contact; and an upper interconnection line disposed on and electrically connected to the magnetic tunnel junction pattern.

6. The magnetic memory device of claim 1, further comprising:

a lower insulating layer interposed between the substrate and the lower interlayer insulating layer, wherein a bottom surface of the lower insulating layer is coplanar with a bottom surface of the bottom electrode contact.

7. The magnetic memory device of claim 1, further comprising:

a capping insulating layer and an upper interlayer insulating layer, which are sequentially stacked on the lower interlayer insulating layer, wherein the lower interlayer insulating layer comprises recessed regions provided at opposite sides of the magnetic tunnel junction pattern, from a cross-sectional view, and wherein the capping insulating layer:

covers a side surface of the magnetic tunnel junction pattern, is interposed between the side surface of the magnetic tunnel junction pattern and the upper interlayer insulating layer, and extends into a region between the lower interlayer insulating layer and the upper interlayer insulating layer.

8. The magnetic memory device of claim 1, wherein the magnetic tunnel junction pattern covers an entire top surface of the bottom electrode contact.

9. A magnetic memory device, comprising:

a first interlayer insulating layer on a substrate;

a bottom electrode contact on the first interlayer insulating layer;

a second interlayer insulating layer covering the bottom electrode contact;

a lower insulating layer interposed between the substrate and the second interlayer insulating layer; and a magnetic tunnel junction pattern on the bottom electrode contact and the second interlayer insulating layer, wherein the bottom electrode contact comprises a third region, a second region, and a first region, which are sequentially arranged in a first direction perpendicular to a top surface of the substrate, wherein a first width of the first region of the bottom electrode contact is smaller than a second width of the second region of the bottom electrode contact, when measured in a second direction parallel to the top surface of the substrate, wherein a third width of the third region of the bottom electrode contact is larger than the second width of the second region of the bottom electrode contact, when measured in the second direction, wherein the bottom electrode contact is disposed in the lower insulating layer, and wherein a width of the bottom electrode contact in the lower insulating layer is smaller than the third width of the third region of the bottom electrode contact.

10. The magnetic memory device of claim 9, wherein the second interlayer insulating layer comprises a third insulating pattern, a second insulating pattern, and a first insulating pattern, which are sequentially stacked on the substrate, wherein the third region of the bottom electrode contact is disposed in the third insulating pattern, wherein the second region of the bottom electrode contact is disposed in the second insulating pattern, wherein the first region of the bottom electrode contact is disposed in the first insulating pattern, and wherein the first insulating pattern, the second insulating pattern, and the third insulating pattern comprise different materials from each other.

11. The magnetic memory device of claim 10, wherein the first insulating pattern comprises a material having a slower etch rate than the second insulating pattern in a specific etching process, and wherein the third insulating pattern comprises a material having a faster etch rate than the second insulating pattern in a specific etching process.

12. The magnetic memory device of claim 9, further comprising:

a lower interconnection line disposed between the substrate and the bottom electrode contact and electrically connected to the bottom electrode contact;

a data storing structure on the bottom electrode contact, which comprises a bottom electrode; and an upper interconnection line disposed on and electrically connected to the data storing structure, wherein a bottom surface of the bottom electrode contact is in contact with the lower interconnection line, and wherein a top surface of the bottom electrode contact is in contact with the bottom electrode of the data storing structure.

13. The magnetic memory device of claim 12, further comprising:

a capping insulating layer, a third interlayer insulating layer, and a fourth interlayer insulating layer, which are sequentially stacked on the second interlayer insulating layer, wherein a bottom surface of the bottom electrode contact is coplanar with a bottom surface of the lower insulating layer, and wherein the fourth interlayer insulating layer covers the upper interconnection line.

14. The magnetic memory device of claim 9, wherein the second interlayer insulating layer comprises recessed regions provided at opposite sides of the magnetic tunnel junction pattern, from a cross-sectional view, and wherein the magnetic tunnel junction pattern covers an entire top surface of the bottom electrode contact.

15. A magnetic memory device, comprising:
a lower interconnection line on a substrate;
a first interlayer insulating layer provided on the substrate to cover a side surface of the lower interconnection line;
a bottom electrode contact on the first interlayer insulating layer;
a second interlayer insulating layer covering a side surface of the bottom electrode contact;
a lower insulating layer interposed between the first interlayer insulating layer and second interlayer insulating layer; and
a data storing structure on the bottom electrode contact,
wherein the data storing structure comprises a bottom electrode, a magnetic tunnel junction pattern, and a top electrode, which are sequentially stacked on the bottom electrode contact,
wherein the second interlayer insulating layer has recessed regions provided at opposite sides of the data storing structure, from a cross-sectional view,
wherein the bottom electrode contact comprises a plurality of first regions and a plurality of second regions, which are alternately stacked in a first direction perpendicular to a top surface of the substrate, wherein when measured in a direction parallel to the top surface of the substrate, each of the first regions of the bottom electrode contact has a first width and each of the second regions of the bottom electrode contact has a second width different from the first width, wherein the bottom electrode contact is disposed in the lower insulating layer, and wherein a width of the bottom electrode contact in the lower insulating layer is smaller than the first width of each of the first regions of the bottom electrode contact.

16. The magnetic memory device of claim 15, further comprising:
an upper interconnection line disposed on the data storing structure and electrically connected to the data storing structure,
wherein a bottom surface of the bottom electrode contact is in contact with the lower interconnection line, and
wherein a top surface of the bottom electrode contact is in contact with the bottom electrode of the data storing structure.

17. The magnetic memory device of claim 16, further comprising:
a capping insulating layer, a third interlayer insulating layer, and a fourth interlayer insulating layer, which are sequentially stacked on the second interlayer insulating layer,
wherein the bottom surface of the bottom electrode contact is coplanar with a bottom surface of the lower insulating layer, and
wherein the fourth interlayer insulating layer covers the upper interconnection line.

18. The magnetic memory device of claim 15, wherein the data storing structure covers an entire top surface of the bottom electrode contact.

* * * * *